US012755808B2

(12) United States Patent
Hu

(10) Patent No.: US 12,755,808 B2
(45) Date of Patent: *Oct. 6, 2026

(54) BLOCK FAMILY ERROR AVOIDANCE BIN SCANS AFTER MEMORY DEVICE POWER-ON

(71) Applicant: Micron Technology, Inc., Boise, ID (US)

(72) Inventor: Guang Hu, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 122 days.

This patent is subject to a terminal disclaimer.

(21) Appl. No.: 18/953,302

(22) Filed: Nov. 20, 2024

(65) Prior Publication Data

US 2025/0087292 A1 Mar. 13, 2025

Related U.S. Application Data

(63) Continuation of application No. 17/898,725, filed on Aug. 30, 2022, now Pat. No. 12,183,413.

(51) Int. Cl.

| | |
|---|---|
| ***G11C 29/02*** | (2006.01) |
| ***G11C 29/04*** | (2006.01) |
| ***G11C 29/52*** | (2006.01) |

(52) U.S. Cl.

CPC ............ *G11C 29/52* (2013.01); *G11C 29/022* (2013.01); *G11C 29/04* (2013.01); *G11C 2029/0407* (2013.01)

(58) Field of Classification Search

CPC .......... G11C 2029/0407; G11C 29/021; G11C 29/022; G11C 29/023; G11C 29/028; G11C 29/04; G11C 29/52

USPC ...................................................... 365/185.09

See application file for complete search history.

(56) References Cited

U.S. PATENT DOCUMENTS 12,183,413 B2 * 12/2024 Hu ........................ G11C 29/023
2022/0164263 A1 * 5/2022 Liikanen ............ G11C 16/3436
2023/0266904 A1 * 8/2023 Kientz .................. G06F 3/0679

* cited by examiner

*Primary Examiner* — Ly D Pham
(74) *Attorney, Agent, or Firm* — Lowenstein Sandler LLP

(57) ABSTRACT

A method includes identifying a read level offset assigned to a final bin in a scan order defined for a set of bins, identifying a set of bit error metric values by performing, using the read level offset, a scan operation with respect to a block of memory cells of the memory array, determining whether a final bit error metric value of the set of bit error metric values is greater than or equal to a threshold value, in response to determining that the final bit error metric value is greater than or equal to the threshold value, identifying a lowest bit error metric value of the set of bit error metric values, and selecting, from the set of bins, a bin having an assigned read level offset corresponding to the lowest bit error metric value.

20 Claims, 11 Drawing Sheets

500

| Temperature 510 | Read delay 520 | BEM value comparison 530 | Optimal bin 540 |
|---|---|---|---|
| N/A | N/A | Bin X-1 updated BEM value < Bin X BEM value | Bin X-1 |
| Range 1 | Active state 1 | Bin X-1 updated BEM value ≥ Bin X BEM value | Bin X |
| Range 1 | Else 1 | Bin X-1 updated BEM value ≥ Bin X BEM value | Bin X-1 |
| Range 2 | Active state 2 | Bin X-1 updated BEM value ≥ Bin X BEM value | Bin X |
| Range 2 | Else 2 | Bin X-1 updated BEM value ≥ Bin X BEM value | Bin X-1 |

FIG. 5

BLOCK FAMILY ERROR AVOIDANCE BIN SCANS AFTER MEMORY DEVICE POWER-ON

CROSS-REFERENCE TO RELATED APPLICATIONS

The present application is a continuation of U.S. patent application Ser. No. 17/898,725, filed on Aug. 30, 2022, the entire contents of which are hereby incorporated by reference herein.

TECHNICAL FIELD

Embodiments of the disclosure relate generally to memory sub-systems, and more specifically, relate to implementing block family error avoidance (BFEA) bin scans after memory device power-on.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a diagram of a power-on scan data structure, in accordance with some embodiments of the present disclosure.

DETAILED DESCRIPTION

Figure 1A:
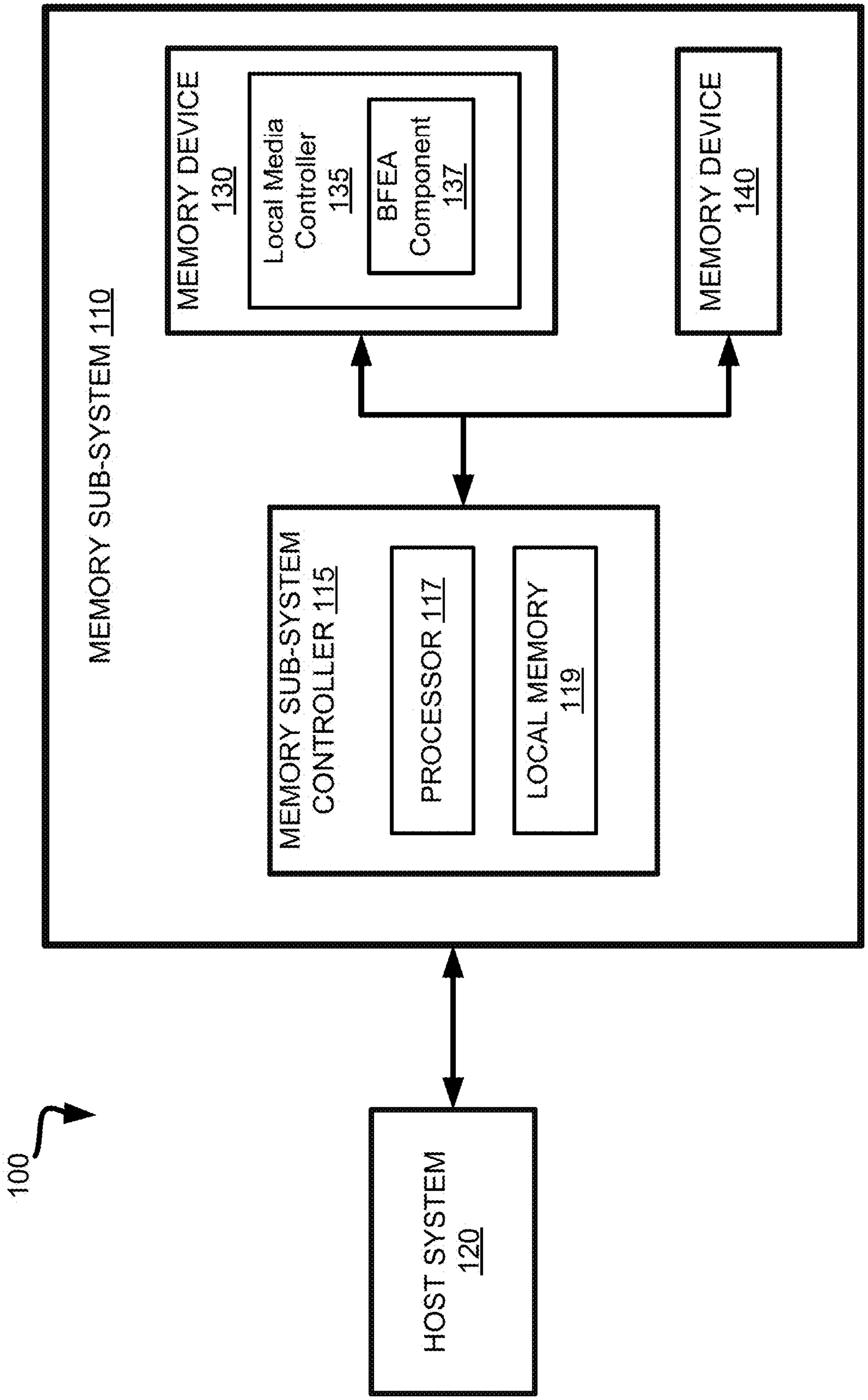
FIG. 1A illustrates an example computing system that includes a memory sub-system, in accordance with some embodiments of the present disclosure.

Aspects of the present disclosure are directed to implementing block family error avoidance (BFEA) bin scans after memory device power-on. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as “0” and “1”, or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g. oxide) layer. A 3D memory device can have a “top deck” corresponding to a first side and a “bottom deck” corresponding to a second side. Without loss of generality, the first side can be a drain side and the second side can be a source side. For example, a 3D memory device can be a 3D replacement gate memory device having a replacement gate structure using wordline stacking.

A memory cell (“cell”) can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ can be fit into the working range allowing for storage and reliable detection of multiple values of the charge $Q_k$, k=1, 2, 3 . . . . The distributions are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCS, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

As data is repeatedly written and erased in a memory device, such as a flash memory device, the memory device may be more susceptible to errors due to various types of noise and disturb mechanisms inherent within the memory cell, which may be exacerbated with repeated programming. As a result, bit error metrics such as bit error counts and bit error rates (e.g., raw bit error rates (RBERs)) for the memory device can increase over time. Given this pattern, the end-of-life bit error metrics for these devices are much higher as compared to the beginning-of-life bit error metrics for the respective devices.

To address read errors, a memory sub-system may use an error correction technique to correct errors and verify that the data written into the memory device is the same as the data being read from the respective memory device. In some embodiments, the error correction technique can include a low-density parity check (LDPC). For example, an encoder (e.g., LDPC encoder) can be used to encode data being written to a memory device to generate a codeword (e.g., compute parity bits). A codeword can include a particular amount of data which may correspond to a data transfer size. A codeword can include additional digits as a result of encoding, such as parity digits. For example, a codeword can include raw data ("hard data") initially determined by a hard read. A decoder (e.g., LDPC decoder) can receive the codeword attempt to decode the codeword. Along with the hard data, a decoder can receive soft data that corresponds to the hard data of the codeword (e.g., indicates confidence information about the hard data). The soft data can be determined from soft read(s) of a memory cell (following a hard read of the memory cell) to determine a bit of the codeword. The encoding and decoding processes performed by the respective encoder and decoder can be such that errors in the codeword can be detected and/or corrected by during the decoding process. Illustratively, the encoder can receive, from a host device, k digits of data and generate a codeword including n digits of data (i.e., an n-digit codeword). For example, a digit of data can be a binary digit (i.e., bit). The n-digit codeword can uniquely correspond to the k digits of data, and the n-digit codeword can be stored in the memory sub-system in place of the k digits of data.

One phenomenon observed in memory devices is slow charge loss (SCL). Charge loss due to SCL can occur as a function of elapsed time since programming and/or temperature. Charge loss can cause $V_T$ distribution shift, in which $V_T$ distributions shift towards lower voltage levels. That is, the $V_T$ distribution shift can be proportional to the elapsed time from a programming operation to a read operation and/or temperature. Charge loss and the corresponding $V_T$ distribution shift can, over time, lead to increasing bit error metric values, such as bit error counts and/or bit error rates (e.g., RBERs). For example, trigger rate refers to a rate of read retry errors due to the failure to decode during an initial read. The trigger rate (TR) can illustratively be calculated as TR=N/T, where N is the number of read errors and Tis the total number of reads. As used herein, trigger rate margin (TRM) refers to a threshold amount of trigger rate to meet system performance specification (e.g., a buffer of fail bits where the system can still perform acceptably). For example, if the system can tolerate an error of 100 fail bits, then the read level setting can be set at the level where the number of fail bits is 50 or fewer bits, which corresponds to a buffer of 50 bits (2× buffer or about 6 dB).

Depending on the system workload, it is possible to have variations in the elapsed time since programming across blocks of the memory device. These variations in the elapsed time since programming can result in varying, non-uniform $V_T$ distribution shifts of respective blocks if the programming of blocks is spaced significantly in time. As a result of these non-uniform $V_T$ distribution shifts, it can be difficult to determine or predict an optimal read level offset that can be applied to the majority of the blocks to address charge loss without compromising performance.

Media management techniques can be used to track center read level changes and charge loss to improve system efficiency and performance. In some memory devices, one media management technique to track charge loss due to SCL is block family error avoidance (BFEA). For example, charge loss and resulting $V_T$ distribution shift can be selectively tracked for programmed blocks grouped by block families, and appropriate voltage offsets, which are based on block affiliation with a certain block family, are applied to the base read voltage levels in order to perform read operations. The term "block family" refers to a set of blocks that have been programmed within a specified time window and a specified temperature window. Since the time elapsed after programming and temperature are the main factors affecting charge loss and $V_T$ distribution shift, all blocks and/or partitions within a single block family are presumed to exhibit similar distributions of threshold voltages in memory cells, and thus would require the same voltage offsets to be applied to the base read voltage levels for read operations. The term "base read voltage level" refers to the initial threshold voltage level exhibited by the memory cell immediately after programming. In some implementations, base read voltage levels may be stored in the metadata of the memory device.

Block families may be created asynchronously with respect to block programming events. In an illustrative example, a new block family may be created whenever a specified period of time (e.g., a predetermined number of minutes) has elapsed since creation of the last block family or the reference temperature of memory cells has changed by more than a specified threshold value. The memory sub-system controller may maintain an identifier of the active block family, which is associated with one or more blocks as they are being programmed.

The memory sub-system controller may periodically perform a calibration process ("calibration scan") in order to evaluate a data state metric (e.g., a bit error rate) and associate each block family with one of the predefined time-after-programming (TAP) bins ("bins"). For example, each block family can be assigned to a respective bin. Each bin, in turn, can be associated with at least one read voltage offset to be applied for read operations. Each read voltage offset of a bin can be designated for a respective logical level. Each bin can have a bin index. The associations of block families with bins may be stored in respective metadata tables maintained by the memory sub-system controller.

However, over time, different sets of memory cells (e.g., pages of a block) may experience various numbers of program-erase cycles, read operations (e.g., causing read disturb), and media management operations. As a result, the bin block assignment may no longer be accurate for reading data from all pages of the blocks associated within the bin, thus increasing the bit error rate and possibly resulting in read errors. "Read error" refers to a failure to decode one or more codewords that have been retrieved from a memory device in response to a read command. Read errors may be associated with host-initiated read operations or system-initiated scanning operations and may occur due to, for example, the measured $V_T$ exhibited by the memory cell mismatching the applied read voltage level due to temporal voltage shift, the requested data being subjected to noise or interference, etc. In a read error, the number of bit errors in the read data is greater than what the underlying ECC may correct and this results in an ECC failure.

A scan operation can be periodically performed with respect to each block of the memory device to determine whether the read level offset for the block, and thus the bin assignment, should be updated to better track charge loss and the corresponding $V_T$ distribution shift over time. For example, if the scan operation indicates that the read level offset should be updated to the read level offset assigned to another bin (e.g., bin 2), then the block can be reassigned to the other bin. The periodicity of the scan operation with respect to a block can be a function of the length of time it takes to scan each block, and the total number of blocks of the memory device.

A block of the memory device can operate in a transient state. For example, for a 3D memory device, the transient state is a state during which a channel polarization bias of the block moves toward a negative voltage relative to a ground voltage (e.g., 0 V) reference. The negative voltage can result from the capacitive coupling that is generated after repeated read operations. After enough time passes from the last read operation to be performed with respect to the block (e.g., about 10 seconds(s) to about 100 s), the block of the memory device can enter a stable state. The stable state is a state during which the channel polarization bias of the block moves toward the ground voltage (e.g., 0V).

The optimal bin assignment for the block while in the transient state can be different than the optimal bin assignment for the block while in a non-transient state (e.g., stable state or a transition state between the stable state and the transient state). This can be due to differences in read metrics (e.g., RWB and $V_T$) between the transient state and the stable state, which is caused by the different electrical properties observable in the stable and transient states. The stable state can be a short-lived state, and the block can be in the transient state for the majority of the time that the memory device is operating. For example, the block can transition from the stable state to the transient state in an amount of time on the order of 10 milliseconds (ms). Accordingly, since blocks of the memory device will most likely be in the transient state during memory device operation, the read level offsets assigned to respective bins used for reading the blocks can be optimized for the transient state.

If the memory device is powered off for a long time, the resulting charge loss can cause bin misalignment with respect to a block due to the change in read level offset that may be needed to read a block. Since the memory device may not know how long the memory device has been powered off, the local media controller can initiate a scan operation after the memory device is powered on to determine a bin assignment block for the block. Moreover, if the memory device is powered off for a long time, a block of the memory device can initially be in the stable state at the moment when the memory device is powered on. However, as discussed above, the bin assignments may be optimized for the transient state. For example, the stable state can cause a bin shift "to the right" (e.g., if Bin X is selected as the optimal bin during the stable state, then Bin X−1 may be the true optimal bin). Thus, performing the scan operation before fully entering the transient state can lead to sub-optimal block bin assignments, which in turn can lead to increases in read errors.

To address the potential of sub-optimal bin assignments after powering on the memory device, in some implementations, the local media controller can implement a scan delay. The scan delay can be defined as a delay between the time that the memory device is powered on and the time that the scan operation is initiated. The scan delay can be chosen to be long enough to ensure that the block is either in the transient state, or a transition state that is sufficiently close to the transient state. For example, the scan delay can be on the order of 10 ms. However, implementing such a scan delay can result in negative impacts to memory device performance (e.g., decreased ability to perform read operations) during the transition period between the stable state and the transient state.

Aspects of the present disclosure address the above and other deficiencies by implementing BFEA scans after memory device power-on. In an illustrative example, a controller can detect a power on event with respect to the memory device. In response to detecting the power on event, the controller can select a block from a set of blocks of the memory device. The controller can then perform a BFEA scan with respect to the block (e.g., by scanning one or more pages of the block). For example, the controller can perform the BFEA scan with respect to a set of pages addressable by a selected set of wordlines of the block (e.g., randomly selected set of wordlines). The BFEA scan can include a first scan performed to select a bin of the set of bins. The bins can be sequentially ordered such that each bin of the set of bins can have a respective bin index, where the read level offsets assigned to the bins can be used in ascending order of bin index (e.g., if the set of bins includes N bins, then a read level offset of Bin 1 is used first and a read level offset of Bin N is used last).

To perform the first scan with respect to the block, the controller can select a bin of the set of bins, read a chosen page using the read level offset assigned to the bin, and determine the resulting bit error metric (BEM) value. The controller can then determine whether the BEM value satisfies a threshold condition (e.g., determine whether the BEM value for the bin is less than a threshold BEM value). In some embodiments, the BEM value is a bit error count (BEC). In some embodiments, the BEM value is a bit error rate (BER). For example, the BEM value can be a raw bit error rate (RBER). If the BEM value satisfies the threshold condition (e.g., the BEM value is less than the threshold BEM value), then the bin is assigned to the block family.

Otherwise, if the BEM value does not satisfy the threshold condition (e.g., the BEM value is greater than or equal to the threshold BEM value), then the controller can select the next bin in the scan order. The controller can then similarly determine a BEM value using the read level offset assigned to the next bin, and determine whether the BEM value satisfies the threshold condition. If each bin of the set of bins is determined to have a BEM value that does not satisfy the threshold condition, then the controller can select the bin assigned with the read level offset resulting in the lowest BEM value. The selected bin can be denoted Bin X.

The BFEA scan can further implement a second scan to determine whether the selected bin is indeed the optimal bin for assigning the block. During the second scan, the controller can perform another scan using the read level offset of the bin immediately preceding the selected bin in the scan order ("previous bin") to determine an updated BEM value (since a BEM value using the read level offset of the previous bin was determined during the first scan). The previous bin can be denoted as Bin X−1.

The controller can then select the optimal bin by comparing the updated BEM value for Bin X−1 to the BEM value for Bin X to obtain a BEM value comparison. For example, if the BEM value comparison indicates that the updated BEM value for Bin X−1 is less than the BEM value for Bin X, then the controller can select Bin X−1 as the optimal bin without performing any further analysis.

However, if the BEM value comparison indicates that the updated BEM value for Bin X−1 is greater than or equal to the BEM value for Bin X, then the controller can select the optimal bin based on the state of the block. For example, the controller can determine the state of the block from a read delay measurement. A read delay measurement refers to the amount of time it takes for read data to be transferred from the block to the data register of the memory device. If the state of block is the transient state (i.e., the transient state or some transition state that is sufficiently "near" the transient state), then the controller can select Bin X as the optimal bin, since bin assignments are optimized for the transient state. If the state of the block is a non-transient state (e.g., the stable state some transition state that is sufficient "far from" the transient state), then the controller can select Bin X−1 as the optimal bin to account for the non-optimization of bin assignments in a non-transient state.

The BEM value comparison and the read delay measurement can be included in a set of parameters. The set of parameters can be used by the controller to identify a state of the block. The set of parameters can further include a temperature measurement for the memory device. The controller can use a data structure (e.g., lookup table) to determine the optimal bin from the set of parameters. Further details regarding the data structure will be described below with reference to FIGS. 4-6.

For example, if the updated BEM value for Bin X−1 is less than the BEM value for Bin X, then the data structure can indicate that Bin X−1 is the optimal bin regardless of other parameters of the set of parameters temperature measurement and/or read delay measurement. If the updated BEM value for Bin X−1 is greater than or equal to the BEM value for Bin X, then the controller can use other parameters of the set of parameters to select Bin X−1 or Bin X as the optimal bin. For example, if the read delay measurement for the temperature measurement is approximately equal to the transient state reference read delay value, this indicates that the block is in the transient state and that Bin X is the optimal bin in this scenario. Accordingly, using the data structure, the controller can confirm that Bin X is the optimal bin.

As another example, if the read delay measurement for the temperature measurement is not approximately equal to the transient state reference read delay value, this indicates that the block is in the stable state and that Bin X−1 is the optimal bin in this scenario. Accordingly, using the data structure, the controller can replace Bin X with Bin X−1 as the optimal bin. Further details regarding implementing bin scans after memory device power-on will be described below with reference to FIGS. 1A-5.

Advantages of the present disclosure include, but are not limited to, improved memory device performance and reliability. For example, embodiments described herein can achieve improved read performance upon power up by reducing read errors.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory device 103 can further include a block family error avoidance (BFEA) component 137. The BFEA component 137 can be implemented by the memory sub-system controller 115 and/or the local media controller 135. The BFEA component 137 can receive a set of bins. The set of bins can be predefined and stored on the local media controller 135. Each bin of the set of bins corresponds to a grouping of blocks of the memory device 130. Each bin of the set of bins is assigned with a respective read level offset.

The local media controller 135 can receive a request to perform a read operation with respect to a block of the memory device 130 from the host system 120 via the memory sub-system controller 115. Upon receiving the request, the BFEA component 137 can select a read level offset for the block. More specifically, the BFEA component 137 can identify the bin to which the block is assigned to, and select the read level offset assigned to the block. Further details regarding the operations of the BFEA component 137 will be described below with reference to FIGS. 3-6.

Figure 1B:
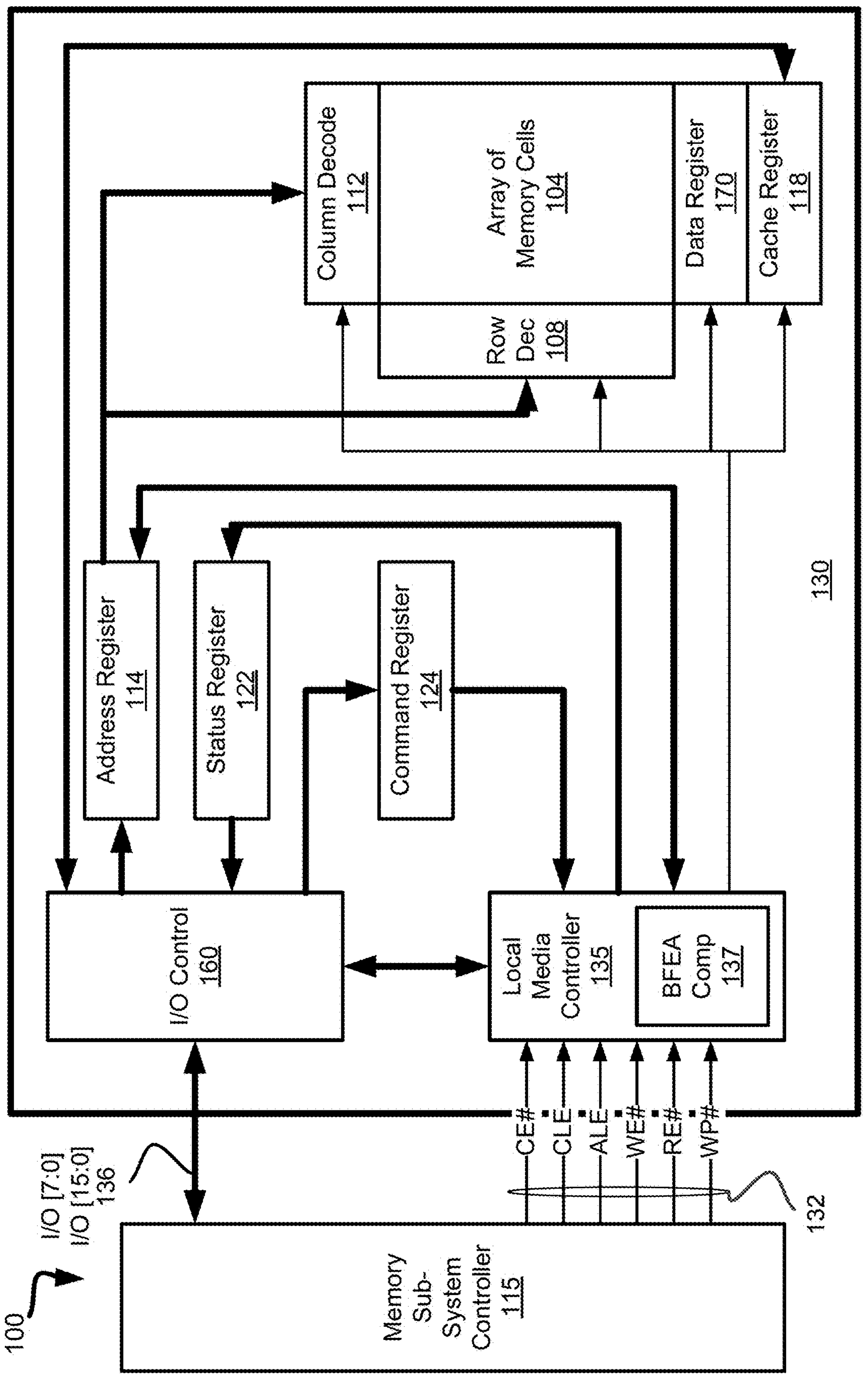
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 112 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 112 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 112 to control the row decode circuitry 108 and column decode circuitry 112 in response to the addresses. In one embodiment, local media controller 135 includes the BV component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
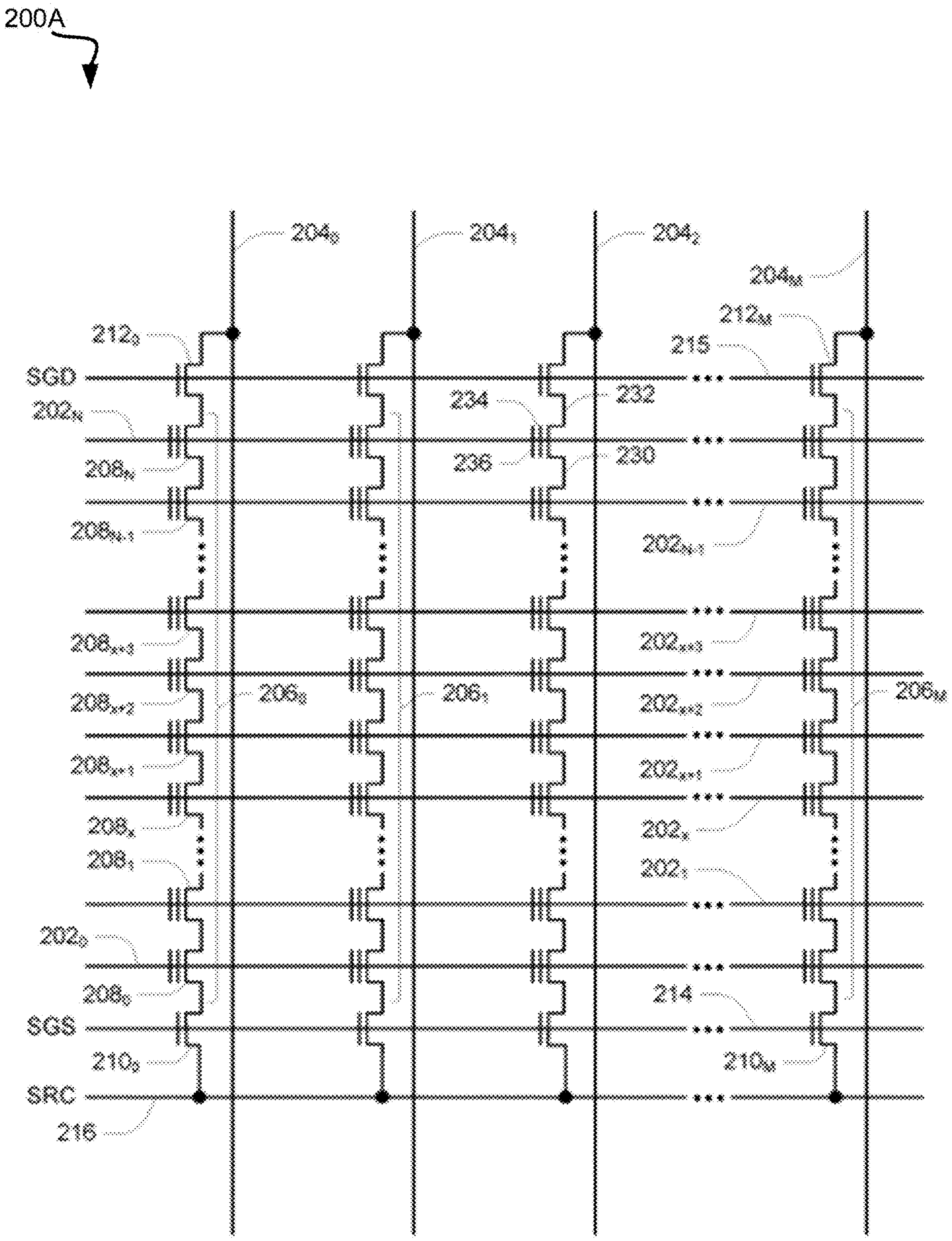
FIGS. 2A-2C are diagrams of portions of an example array of memory cells included in a memory device, in accordance with some embodiments of the present disclosure.
Figure 2B:
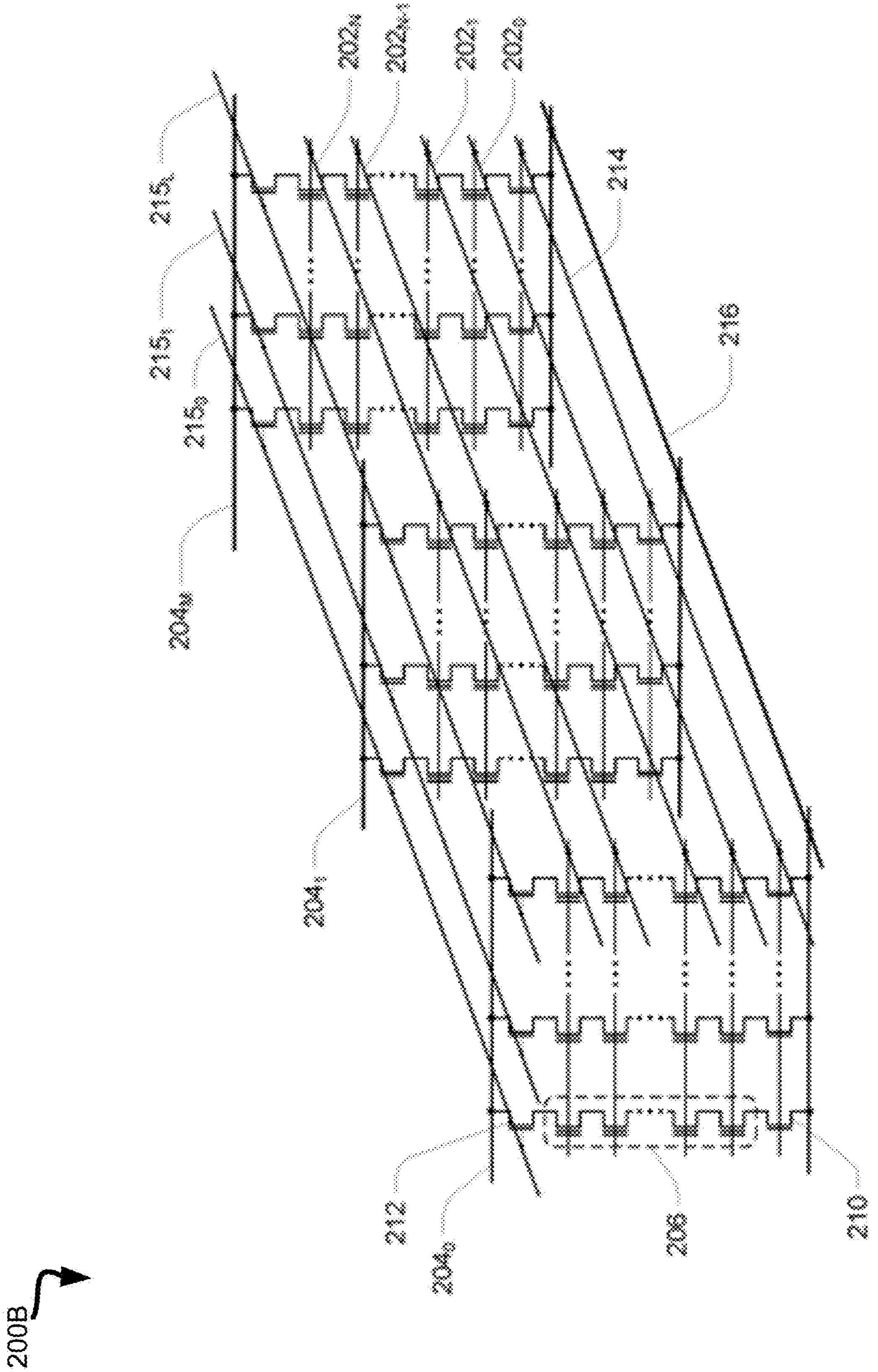
Figure 2C:
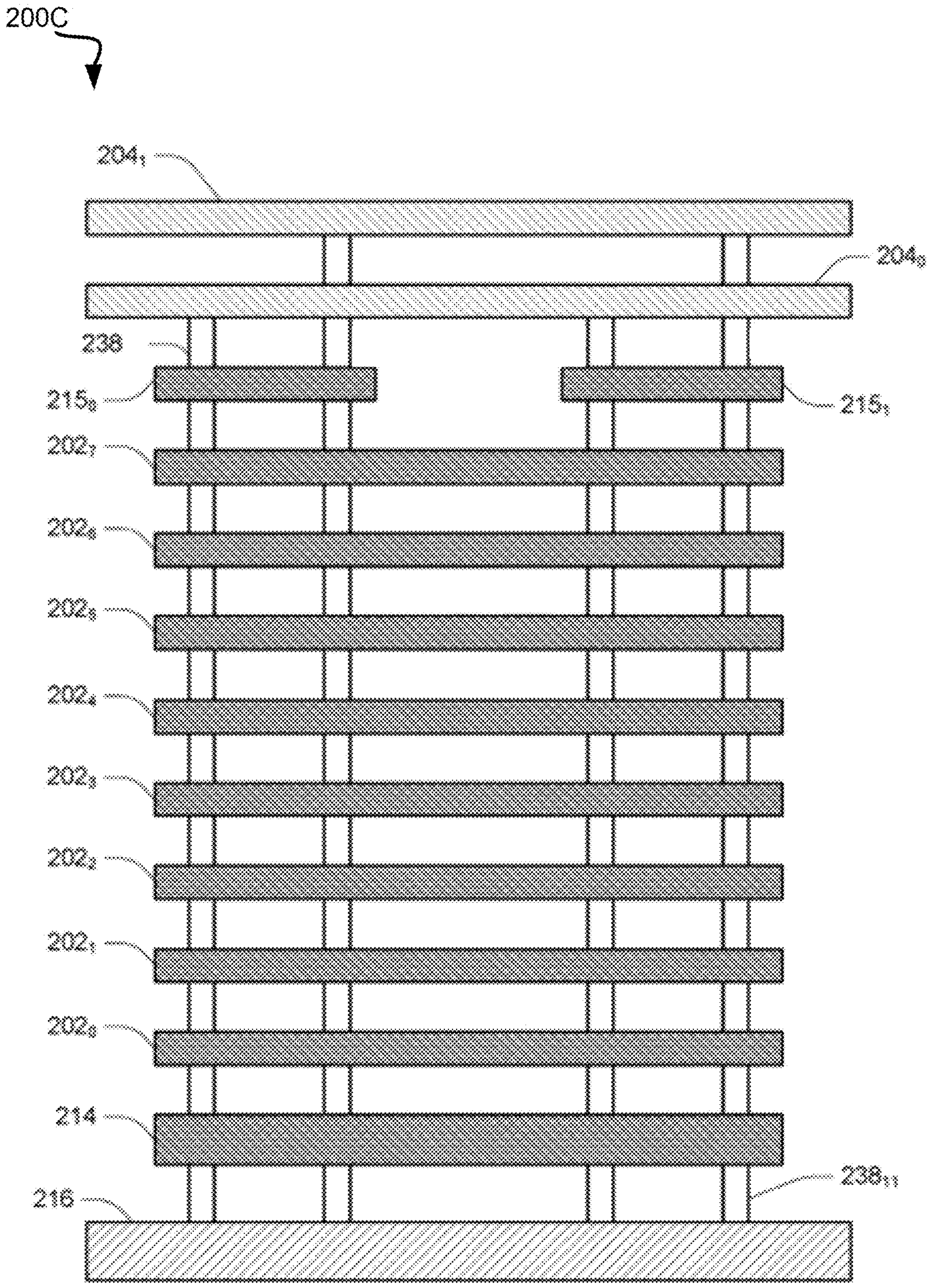

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly addressable by a given wordline 202. For example, memory cells 208 commonly addressable by wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly addressable by wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly addressable by a given wordline 202 may also define a physical page of memory cells 208. For certain memory devices, all memory cells commonly addressable by a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells addressable by wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Groups of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly addressable by each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) 238 represent the channel regions of different strings of series-connected memory cells (e.g., strings 206 of FIGS. 2A-2B) selectively connected to the bitline $204_0$ and/or bitline $204_1$. A memory cell (not depicted in FIG. 2C) may be formed at each intersection of a wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
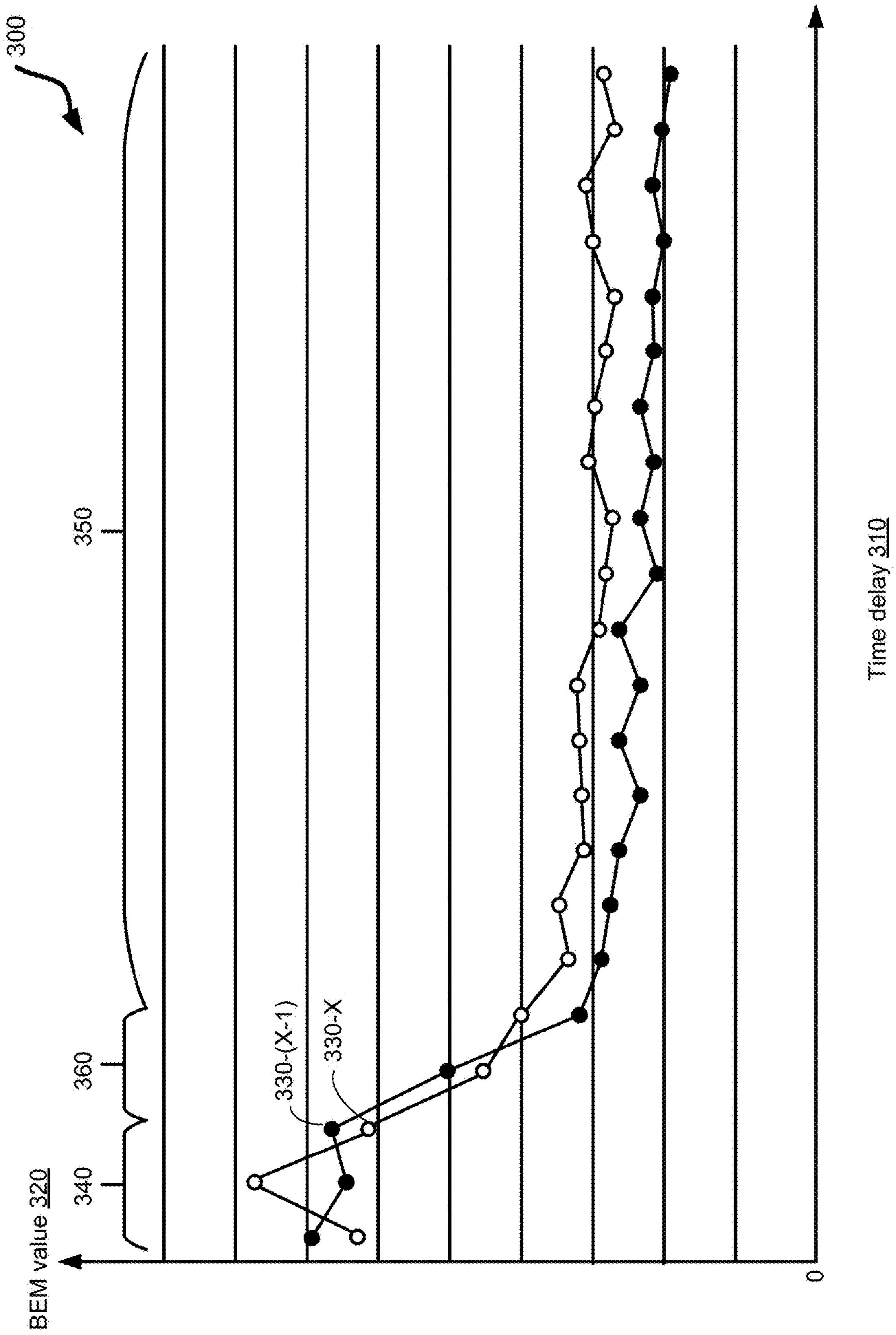
FIG. 3 is a graph of example bit error metric measurements over time, in accordance with some embodiments of the present disclosure.

FIG. 3 is a graph 300 of example bit error metric (BEM) measurements, in accordance with some embodiments of the present disclosure. The graph 300 includes an x-axis 310 corresponding to time delays in milliseconds (ms) after a memory device is powered on. The graph 330 further includes a y-axis 320 corresponding to bit error count (BEM) values. In some embodiments, the BEM values are bit error counts (BEC). In alternative embodiments, the BEM values are bit error rates (BER). For example, the BER can be a raw BER (RBER).

Graph 300 includes plots of BEC measurements obtained using a read level offset for Bin X−1 and a read level offset for Bin X. for two bins of a set of bins, Bin X−1 and Bin X, during a scan operation. More specifically, the scan operation can be performed using a page read (e.g., XP page read) with respect to a set of wordlines of the block. For example, the wordlines of the set of wordlines can be randomly selected. Bin X−1 and Bin X can be included in a set of bins. Each bin of the set of bins can have a respective bin index. For example, if the set of bins includes N bins, then each bin can have a respective bin index i, where i∈[1, N]. The bin index defines a scan order of the set of the bins. For example, bin 1 is the first bin eligible to be scanned during a scan operation and bin N is last bin eligible to be scanned during the scan operation. Each bin of the set of bins can define a respective read level offset. Each read level offset can be used to perform read operations with respect to each block assigned to the respective bin.

In this illustrative example, it is assumed that BEC measurements have been plotted for Bin X and are represented by hollow circles (e.g., BEC value 330-X) and that BEC measurements have been plotted for Bin X−1 and are represented by filled circles (e.g., BEC value 330-(X−1)). More specifically, the BEC measurements for Bin X and Bin X−1 have been obtained during a time delay period 340 defining the length of a stable state of the block, a time delay period 350 defining the length of a transient state of the block, and a time delay period 360 defining the length of a transition state (i.e., a state of the block between the stable state and the transient state).

Figure 4:
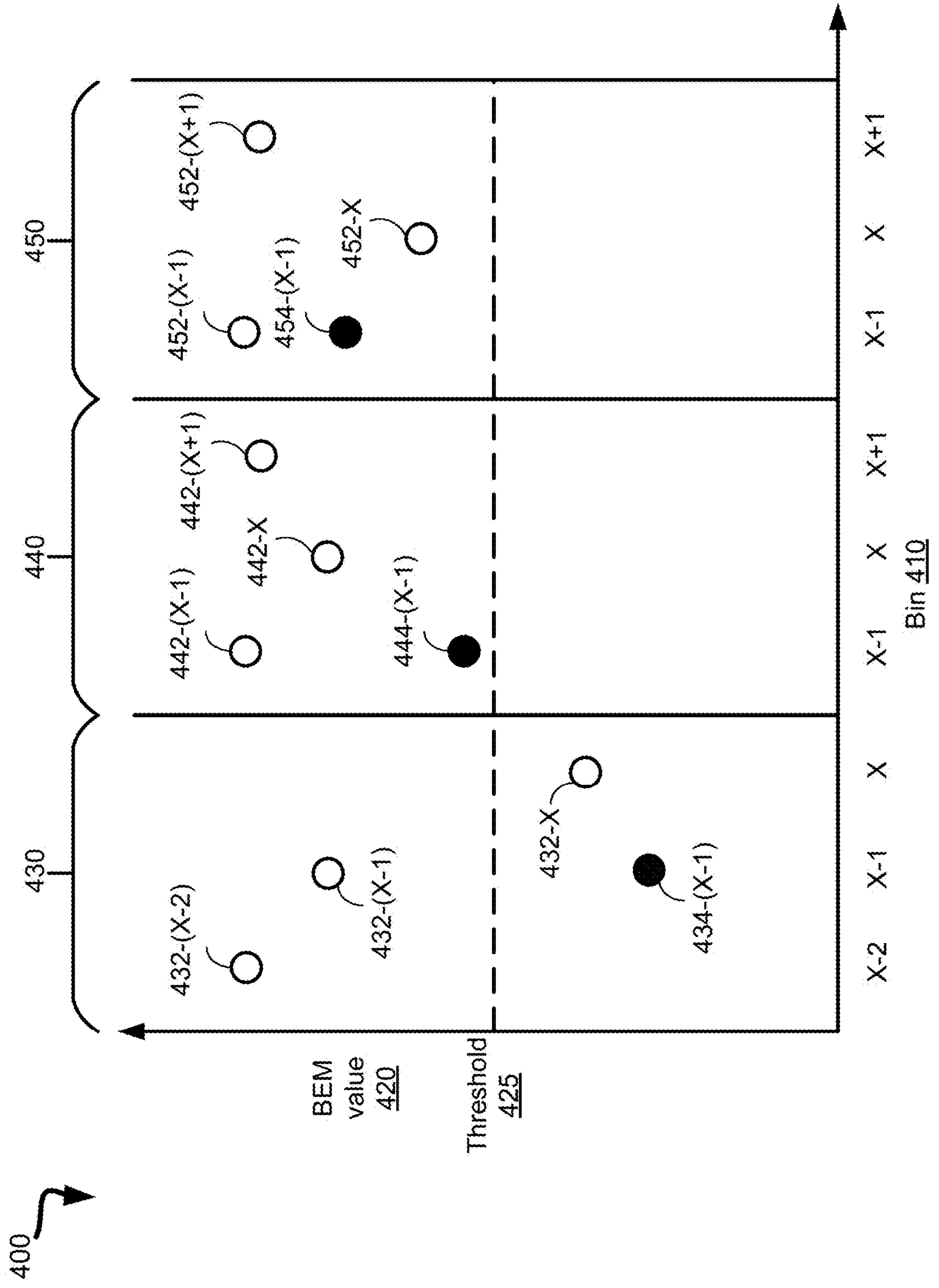
FIG. 4 is a diagram of example bin assignment scenarios during BFEA scans, in accordance with some embodiments of the present disclosure.

FIG. 4 is a graph 400 of example bin assignment scenarios ("scenarios") during BFEA scans, in accordance with some embodiments of the present disclosure. The graph 400 includes an x-axis 410 corresponding to bin indices of a set of bins. Each bin of the set of bins can have a respective bin index. For example, if the set of bins includes N bins, then each bin can have a respective bin index i, where i∈[1, N]. The bin index defines a scan order of the set of the bins. For example, bin 1 is the first bin eligible to be scanned during a scan operation and bin N is last bin eligible to be scanned during the scan operation. Each bin of the set of bins can define a respective set of read level offsets, where each read level offset of the set of read level offsets is determined for a respective logical level.

The graph 400 further includes a y-axis 420 corresponding to bit error metric (BEM) values determined using read level offsets assigned to respective bins of the set of bins during a scan operation. In some embodiments, the BEM values are bit error counts (BEC). In some embodiments, the BEM values are bit error rates (BER). For example, the BER can be a raw BER (RBER). The graph 400 further illustrates a threshold BEM value ("threshold") 425 defined for scan operations. The threshold 425 defines a threshold condition for the BEM value for selecting a bin during a scan operation. For example, if the controller determines, during a scan operation performed with respect to the block using a read level offset, that the resulting BEM value is less than threshold 425, then the controller can tentatively select the corresponding bin as the optimal bin for the block during the scan operation. Otherwise, if the controller determines, during the scan operation, that each read level offset results in a BEM value that is greater than or equal to threshold 425, then the controller can tentatively select, as the optimal bin, the bin of the set of bins assigned with the read level offset resulting in the lowest BEM value.

The graph 400 illustrates scenarios 430-450. During each of the scenarios 430-450, the controller performs a respective BFEA scan with respect to a block (i.e., memory array) of a memory device. More specifically, a BFEA scan can be performed using a page read (e.g., XP page read) with respect to a set of wordlines of the block. For example, the wordlines of the set of wordlines can be randomly selected. Each BFEA scan is performed to determine BEM values of at least a subset of the set of bins.

With reference to scenario 430, a controller can initiate a first scan using the read level offset assigned to Bin X−2 (i.e., the bin of the set of bins having bin index X−2), the read level offset assigned to Bin X−1 (i.e., the bin of the set of bins having bin index X−1) and the read level offset assigned to Bin X (i.e., the bin of the set of bins having bin index X). During the first scan, the controller can determine a BEM value 432-(X−2) for Bin X−2 that exceeds the threshold 425, a BEM value 432-(X−1) for Bin X−1 that exceeds the threshold, and a BEM value 432-X for Bin X that is less than the threshold. It is assumed that Bin X is the first bin of the set of bins determined to have a BEM value that is less than threshold 425. Since the BEM value 432-X is the first bin of the set of bins determined to have a BEM value that is less than threshold 425, the controller can tentatively select Bin X as the optimal bin for the block.

Since the first scan may be performed after a short time delay from when the memory device was powered on, it may be the case that the block is not in the transient state (e.g., the block is in the stable state or a transition state). Further analysis can be performed to determine whether to confirm the tentative selection of Bin X as the optimal bin. To perform the further analysis, the controller can initiate a second scan. During the second scan, the controller can perform another scan with respect to the block using the read level offset assigned to Bin X−1, which is the bin immediately preceding Bin X in the scan order. From the second scan, the controller can determine an updated BEM value 434-(X−1) for Bin X−1. The controller can then obtain a BEM value comparison by comparing BEM value 434-(X−1) to BEM value 432-X. In this illustrative scenario 430, the BEM value comparison indicates that BEM value 434-(X−1) is less than BEM value 432-X.

As will be described in further detail below with reference to FIG. 5, the controller can use a data structure (e.g., lookup table) to select the optimal bin using the BEM value comparison. More specifically, the controller can obtain a set of parameters including the BEM value comparison, and select the optimal bin using the set of parameters. As will be described in further detail below, the set of parameters can further include a measurement of the temperature of the memory device (i.e., temperature measurement) and a measurement of the read delay ("read delay measurement"). For example, the data structure can specify that when the BEM value comparison indicates that the BEM value for Bin X−1 is less than the BEM value for Bin X, then Bin X−1 can be selected as the optimal bin (regardless of any other parameters such as the temperature and read delay measurement). Thus, in scenario 430, the controller can select Bin X−1, and not Bin X, as the optimal bin.

With reference to scenario 440, a controller can initiate a first scan using the read level offset assigned to Bin X−1, the read level offset assigned to Bin X, and the read level offset assigned to Bin X+1 (i.e., the bin of the set of bins having bin index X+1). During the first scan, the controller can determine a BEM value 442-(X−1) for Bin X−1, a BEM value 442-X for Bin X, and a BEM value 442-(X+1) for Bin X+1. In contrast to scenario 430, during the first scan in scenario 440, the controller had to obtain a BEM value for each bin of the set of bins (i.e., bin 1 through bin N) because the BEM value for each bin of the set of bins was determined to exceed the threshold 425. It is assumed that the BEM value 442-X is the lowest BEM value, and that the controller has tentatively selected Bin X as the optimal bin.

Similar to scenario 430, further analysis can be performed to determine whether to confirm the tentative selection of Bin X as the optimal bin. During the second scan, the controller can determine an updated BEM value 444-(X−1) for Bin X−1. The controller can then obtain a BEM value comparison by comparing BEM value 444-(X−1) to BEM value 442-X. In this illustrative scenario 440, the BEM value comparison indicates that BEM value 444-(X−1) is less than BEM value 442-X.

Similar to scenario 430, the controller can use the data structure to select the optimal bin using the BEM value comparison. Similar to scenario 430, the controller can select Bin X−1, and not Bin X, as the optimal bin (regardless of any other parameters such as the temperature and read delay measurement) since the BEM value comparison indicates that BEM value 444-(X−1) is less than BEM value 442-X.

With reference to scenario 450, a controller can initiate a first scan using the read level offset of Bin X−1, the read level offset of Bin X, and the read level offset of Bin X+1. During the first scan, the controller can determine a BEM value 452-(X−1) for Bin X−1, a BEM value 452-X for Bin X, and a BEM value 452-(X+1) for Bin X+1. Similar to scenario 440, during the first scan, the controller had to obtain a BEM value for each bin of the set of bins (i.e., bin 1 through bin N) because the BEM value for each bin of the set of bins was determined to exceed the threshold 425. It is assumed that the BEM value 452-X is the lowest BEM value, and that the controller has tentatively selected Bin X as the optimal bin.

Similar to scenarios 430-440, further analysis can be performed to determine whether to confirm the tentative selection of Bin X as the optimal bin. To perform the further analysis, the controller can initiate a second scan. During the second scan, the controller can determine an updated BEM value 454-(X−1) for Bin X−1. The controller can then obtain a BEM value comparison by comparing BEM value 454-(X−1) to BEM value 452-X. In this illustrative scenario 450 (and in contrast to scenarios 430 and 440), the BEM value comparison indicates that BEM value 454-(X−1) is greater than BEM value 452-X.

Similar to scenarios 430 and 440, the controller can use the data structure to select the optimal bin using the BEM value comparison. However, in this case, the BEM value comparison indicates that that BEM value 454-(X−1) is greater than BEM value 452-X. The controller can leverage other parameters to select the optimal bin. For example, the data structure can maintain, for each temperature range of a set of temperature ranges, at least one reference read delay value defined for the temperature range. More specifically, the at least one reference read delay value can include a transient state reference read delay value indicative of the read delay that is typically observed during the transient state with respect to the temperature range. The read delay measurement of the set of parameters can be used as a proxy to determine whether a block is in a transient state or non-transient state because the transient state reference read delay value is generally smaller than non-transient state (e.g., stable state) read delay values.

A different transient state reference read delay value can be defined for each temperature range due to changes in memory device operation at varying temperatures. In some embodiments, the set of temperature ranges includes a first temperature range (e.g., about 25° C. through about 85° C.) and a second temperature range (e.g., about −25° C. through about 25° C.). In these embodiments, a first transient state reference read delay value can be defined for the first temperature range, and a second transient state reference read delay value can be defined for the second temperature range. As an illustrative example, within the first temperature range, the transient state reference read delay value can be about 25 microseconds the stable state reference read delay value can be about 28 microseconds. As another illustrative example, within the second temperature range, the transient state reference read delay value can be about 23 microseconds and the stable state reference read delay value can be about 26 microseconds.

The controller can identify the temperature range to which the temperature measurement from the set of parameters falls within, and can determine whether the read delay from the set of parameters is approximately equal to the transient state reference read delay value for the temperature range. If the controller determines that the read delay from the set of parameters is approximately equal to the transient state reference read delay value for the temperature range, this means that the block is in the transient state, or that the block is in a transition state sufficiently near the transient state. Thus, the controller can select Bin X as the optimal bin.

Otherwise, if the controller determines that the read delay from the set of parameters is not approximately equal to the transient state reference read delay value for the temperature range, this means that the block is in a stable state, or that the block is in a transition state sufficiently far from the transient state. Thus, the controller can select Bin X−1 as the optimal bin, even though BEM value 454-(X−1) is greater than BEM value 452-X. Further details regarding the data structure will now be described below with reference to FIG. 5.

FIG. 5 is a diagram of a data structure 500, in accordance with some embodiments of the present disclosure. In this example, the data structure 500 is a table. More specifically, the data structure 500 can be a lookup table accessible by a controller of a memory device to select an optimal bin during a BFEA scan. As shown, the data structure 500 includes columns 510-540. Each column corresponds to a respective data structure parameter that can be used to select an optimal bin for assigning a block.

For example, column 510 is a temperature column. More specifically, each entry of column 510 defines a respective temperature range. In this illustrative example, column 510 includes Range 1 and Range 2. For example, Range 1 can be the range $T_1 \leq T \leq T_2$ and Range 2 can be the range $T_3 \leq T \leq T_1$, where $T_3 < T_1 < T_2$. In some embodiments, $T_1$=25° C., $T_2$=85° C., and $T_3$=−25° C.

Column 520 is a read delay column. More specifically, each entry of column 520 defines a respective reference read delay value for each temperature range. In this illustrative example, column 520 includes a transient state reference read delay value for Range 1 ("Transient state 1") and a non-transient state reference read delay value for Range 1 ("Else 1"). For example, Transient state 1 can be defined as $A_1$ microseconds, and Else 1 can be defined as $A_1$ microseconds+$B_1$ microseconds, where $B_1$ is a positive value. As an illustrative example, $A_1$ can be about 25 microseconds and $B_1$ can be about 3 microseconds (i.e., Transient state 1 is about 25 microseconds and Else 1 is about 28 microseconds).

Moreover, in this illustrative example, column 520 includes a transient state reference read delay value for Range 2 ("Transient state 2") and a non-transient state reference read delay value for Range 2 ("Else 2"). For example, Transient state 2 can be defined as $A_2$ microseconds, and Else 1 can be defined as $A_2$ microseconds+$B_2$ microseconds, where $B_2$ is a positive value. As an illustrative example, $A_2$ can be about 23 microseconds and $B_2$ can be about 3 microseconds (i.e., Transient state 2 is about 23 microseconds and Else 2 is about 26 microseconds).

Column 530 is a bin error metric (BEM) value comparison column. More specifically, each entry of column 530 defines a respective BEM value comparison between the BEM value obtained Bin X (i.e., the tentatively selected bin) and the updated BEM value obtained for Bin X−1 (i.e., the bin immediately preceding Bin X in the scan order). Column 540 is an optimal bin column indicating, for a particular combination of temperature range, reference read delay value and BEM value comparison, which of Bin X−1 or Bin X to select as the optimal bin for the block.

For example, a controller can receive a set of parameters including a temperature measurement, a read delay measurement and a BEM value comparison. If the BEM value comparison indicates that the updated BEM value for Bin X−1 is less than the BEM value for Bin X, then the controller can select Bin X−1 as the optimal bin for the block. The selection is made regardless of the temperature measurement and the read delay measurement, as indicated by the not-applicable (N/A) entries.

However, if the BEM value comparison indicates that the updated BEM value for Bin X−1 is greater than or equal to the BEM value for Bin X, then the optimal bin selection can depend on the temperature measurement and the read delay measurement. For example, if the temperature measurement falls within Range 1 and the read delay measurement is approximately equal to Transient state 1, then the controller can select Bin X as the optimal bin for the block. As another example, if the temperature measurement falls within Range 1 and the read delay measurement is approximately equal to Else 1, then the controller can select Bin X−1 as the optimal bin for the block. As another example, if the temperature measurement falls within Range 2 and the read delay measurement is approximately equal to Transient state 2, then the controller can select Bin X as the optimal bin for the block. As another example, if the temperature measurement falls within Range 2 and the read delay measurement is approximately equal Else 2, then the controller can select Bin X−1 as the optimal bin for the block. Further details regarding optimal bin selection are described above with reference to FIG. 4 and will now be described in further detail below with reference to FIG. 6.

Figure 6A:
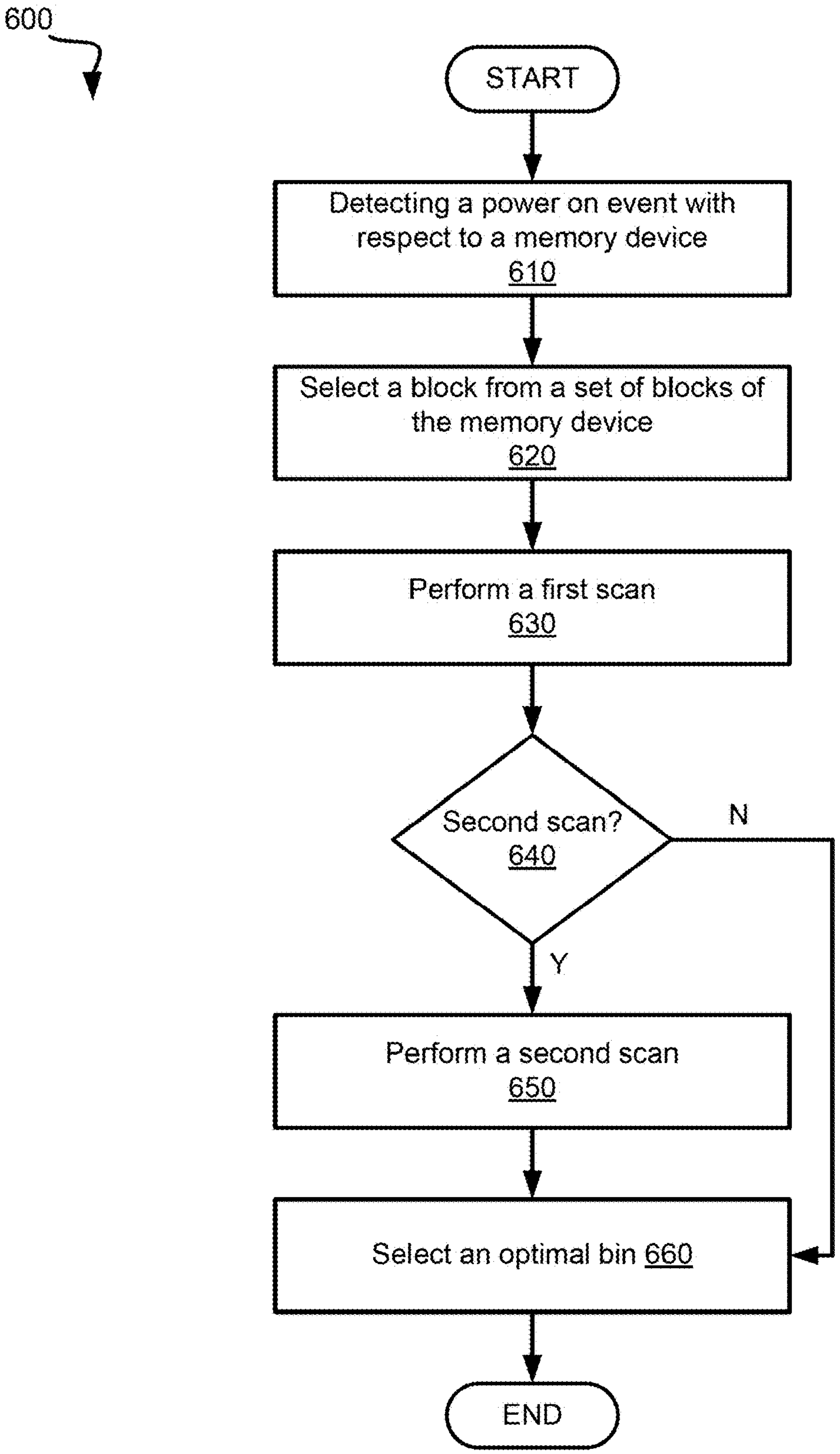
FIGS. 6A-6B are flow diagrams of example methods to implement block family error avoidance (BFEA) bin scans after memory device power-on, in accordance with some embodiments of the present disclosure.

FIG. 6A is a flow diagram of an example method 600 to implement block family error avoidance (BFEA) bin scans after memory device power-on, in accordance with some embodiments of the present disclosure. The method 600 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the BFEA component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a power on event is detected with respect to a memory device and, at operation 620, a block from a set of blocks of the memory device is selected. For example, control logic can detect the power on event and, in response to detecting the power on event, select the block from the set of blocks. The memory device can be the memory device 130 of FIGS. 1A-1B, and the block can be a memory of the memory device (e.g., the memory 104 of FIG. 1B).

At operation 630, a first scan is performed. For example, control logic can cause the first scan to be performed with respect to the block using a set of read level offsets. More specifically, the first scan can be a special BFEA scan performed once after detecting the power on event. Each read level offset of the set of read level offsets is assigned to a respective bin of a set of bins. The first scan can be performed with respect to a page of the block. For example, the first scan can be performed with respect to a set of wordlines of the page (e.g., a set of randomly selected wordlines). The first scan is performed to select, from the set of bins in accordance with a scan order, a bin assigned with a read level offset resulting in a bit error metric (BEM) value. More specifically, control logic can determine, for a subset of the set of bins, a BEM value for each bin of the subset, and select the bin from the subset. For example, the subset can be a proper subset (i.e., the cardinality of the subset is less than the cardinality of the set of bins). As another example, the subset can be the entire set of bins. In some embodiments, the BEM value is a bit error count (BEC). In some embodiments, the BEM value is a bit error rate (BER) (e.g., RBER). Further details regarding the first scan will now be described below with reference to FIG. 6B.

Figure 6B:
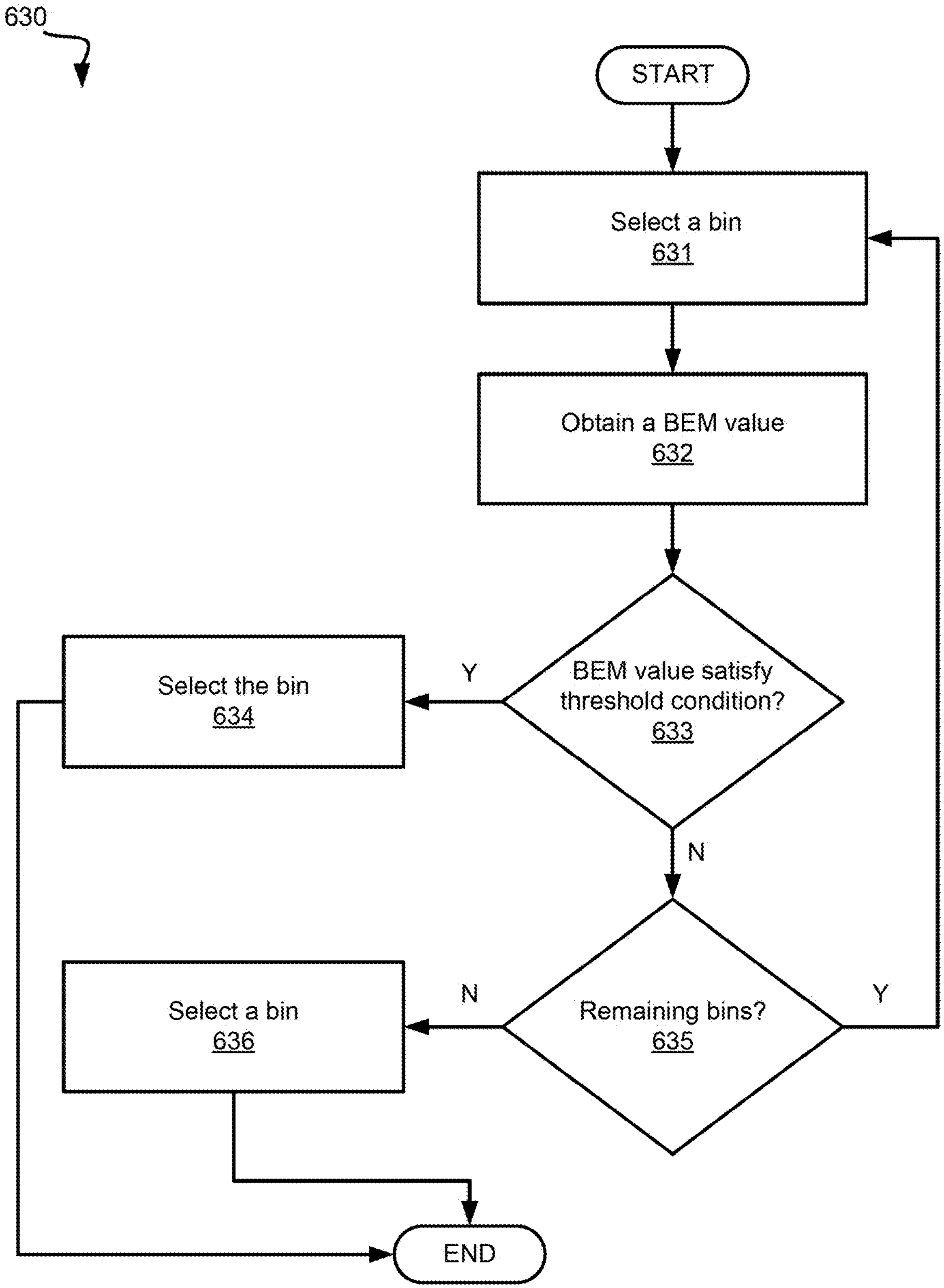

FIG. 6B is a flow diagram of an example method 630 to perform a first scan after detecting a power on event with respect to a memory device, in accordance with some embodiments of the present disclosure. The method 630 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 630 is performed by the BFEA component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 631, a bin is selected. For example, control logic can select an initial bin of a set of bins. A respective read level offset of a set of read level offsets can be assigned each bin of the set of bins. For example, an initial read level offset can be assigned to an initial bin of a set of bins. The initial bin can be determined from a scan order for the set of bins (e.g., the bin of the set of bins having a bin index of 1).

At operation 632, a BEM value is obtained. For example, control logic can obtain the BEM value by performing a scan with respect to the block using the read level offset assigned to the bin.

At operation 633, it is determined whether the BEM value satisfies a threshold condition. For example, control logic can determine whether the BEM value is less than a threshold BEM value.

If the BEM value satisfies the threshold condition (e.g., the BEM value is less than the threshold BEM value), this means then the bin is selected at operation 634. For example, control logic can tentatively select the bin as an optimal bin.

If the BEM value does not satisfy the threshold condition (e.g., the BEM value is greater than or equal to the threshold BEM value), it is then determined whether there are any remaining bins to be selected. For example, control logic can determine whether the last bin that was selected is a final bin of the set of bins, as determined by the scan order (e.g., if the set of bins includes N bins, then the final bin is the bin having a bin index of N within the scan order).

If it is determined that there is at least one remaining bin of the set of bins (e.g., the bin index of the last bin to be scanned is less than N), then the process reverts back to operation 631 to select the next bin of the set of bins. More specifically, the next bin can be determined from the scan order (e.g., if the previous bin to be scanned is the initial bin having a bin index of 1, then the next bin can have a bin index of 2).

If it is determined that there are no remaining bins of the set of bins (e.g., the bin index of the last bin to be scanned is N), this means that there are no BEM values determined to satisfy the threshold condition. At operation 636, a bin is selected. For example, control logic can determine a lowest BEM value from the BEM value, and tentatively select the bin having the read level offset that resulted in the lowest BEM value as the optimal bin. After selecting the bin at either operation 634 and operation 636, the first scan can then terminate.

Referring back to FIG. 6A, at operation 640, it is determined whether a second scan should be performed. For example, control logic can determine whether the bin selected at operation 630 is the initial bin of the scan order.

If the bin selected at operation 630 is not the initial bin of the scan order, then a second scan can be performed at operation 650. For example, control logic can cause, using a second read level offset of the set of read level offsets assigned to a previous bin of the set of bins, a second scan to be performed to obtain an updated BEM value for the previous bin. The previous bin is the bin that immediately precedes the bin selected at operation 630 in the scan order (e.g., the bin having a bin index that is one less than the bin index of the tentatively selected bin). More specifically, the second scan is an additional scan performed, with respect to the block, only using the read level offset of the previous bin.

At operation 660, an optimal bin for the block is selected. For example, control logic can select the optimal bin based on the BEM value of the bin and the updated BEM value of the previous bin. Selecting the optimal bin can include assigning the block to the optimal bin.

In some embodiments, selecting the optimal bin includes obtaining a set of parameters. For example, obtaining the set of parameters can include obtaining at least one of: a temperature measurement associated with the memory device, a read delay measurement, or a BEM value comparison. Obtaining the set of parameters can include obtaining the BEM value comparison by comparing the updated BEM value of the previous bin to the BEM value of the tentatively selected bin.

In some embodiments, selecting the optimal bin can include determining whether the BEM value comparison indicates that the updated BEM value of the previous bin is less than the BEM value of the tentatively selected bin. For example, selecting the optimal bin can include, in response to determining that the BEM value comparison indicates that the updated BEM value of the previous bin is less than the BEM value of the tentatively selected bin, selecting the previous bin as the optimal bin.

As another example, selecting the optimal bin can include, in response to determining that the BEM value comparison indicates that the updated BEM value of the previous bin is greater than or equal to the BEM value of the tentatively selected bin, identifying a state of the block based on the set of parameters, and selecting the optimal bin based on the state of the block. For example, the set of parameters can further include a read delay measurement, and the state of the block can be identified based on the read delay measurement. If the state of the block is a transient state, then the optimal bin can be the tentatively selected bin. If the state of the block is a non-transient state, then the optimal bin can be the previous bin.

In some embodiments, selecting the optimal bin includes using a data structure. For example, the data structure can be a lookup table. The data structure can be maintained as metadata on the memory device prior to initiation of the scan operation. The data structure can include a set of combinations of data structure entries (e.g., temperature ranges, read delay reference values and/or BEM value comparisons). For example, each combination of data structure entries can include at least one of: a respective temperature range, a respective read delay reference value (e.g., transient state read delay reference value or non-transient state read delay reference value), or a respective BEM value comparison (e.g., the BEM value for the previous bin is less than the BEM value for the tentatively selected bin, or the BEM value for the previous bin is greater than the BEM value for the tentatively selected bin). For each combination of data structure entries, the data structure can include a respective optimal bin selection.

For example, if the set of parameters includes a BEM value comparison indicating that the BEM value for the previous bin is less than the BEM value for the tentatively selected bin, then the data structure can indicate that the previous bin is the optimal bin (regardless of any other parameters). Therefore, the controller can select the previous bin as the optimal bin at operation 630.

As another example, if the set of parameters includes a BEM value comparison indicating that the BEM value for the previous bin is greater than the BEM value for the tentatively selected bin, then the controller can decide which bin to select as the optimal bin in view of the other parameters of the set of parameters.

For example, if the temperature measurement falls within a temperature range (e.g., Range 1 or Range 2 as described above with reference to FIG. 5) and the read delay measurement is approximately equal to a transient state reference read delay value for the temperature range (e.g., Transient state 1 for Range 1 or Transient state 2 for Range 2 as described above with reference to FIG. 5), then the data structure can indicate that the tentatively selected bin is the optimal bin. Therefore, the controller can select the tentatively selected bin as the optimal bin at operation 630.

As another example, if the temperature measurement falls within a temperature range (e.g., Range 1 or Range 2 as described above with reference to FIG. 5) and the read delay measurement not approximately equal to the transient state reference read delay value for the temperature range (e.g., Else 1 for Range 1 or Else 2 for Range 2 as described above with reference to FIG. 5), then the data structure can indicate that the previous bin is the optimal bin. Therefore, the controller can select the previous bin as the optimal bin at operation 630. The BFEA scan with respect to the block is complete after the optimal bin for the block is selected at operation 630.

If the bin selected at operation 630 is the initial bin of the scan order (e.g., the initial bin has an associated BEM value that is less than the threshold BEM value, or is associated with the lowest BEM value among each bin of the set of bins), this means that the initial bin of the scan order is selected at operation 630 is selected as the optimal bin at operation 660 without having to perform the second scan.

In view of the above, operations 610-660 can be performed to assign a block to an optimal bin after detecting a power on event. If the updated BEM value for Bin X−1 is less than the BEM value for Bin X, then there is no need for further analysis since the bin assignment shift to the right observed in non-transient states is not relevant. However, if the updated BEM value for Bin X−1 is greater than the BEM value for Bin X, operations 650-660 can be performed to determine, from the set of parameters, which state the block is in. For example, if the block is determined to be in the transient state (e.g., based on the read delay measurement for the temperature measurement), then Bin X is confirmed as the optimal bin. Otherwise, if the block is determined to not be in the transient state (e.g., based on the read delay measurement for the temperature measurement), then Bin X−1 is selected as the optimal bin instead of Bin X.

After the optimal bin is selected for the block, the process can be repeated for each block of the memory device. After the BFEA scan has been performed with respect to a block after detecting the power on event, an additional BFEA scan can be initiated some amount of time after the completion of the BFEA scan that was performed with respect to the block. For example, the amount of time can be defined by a scan granularity. Performing the additional BFEA scan can include performing the first scan similar to that performed at operation 630 to select a bin. However, instead of performing the second scan, the bin is selected as the optimal bin (instead of being tentatively selected as the optimal bin). This is because it is assumed that the scan granularity is long enough to ensure that the block is in the transient state, and thus the bin selection is assumed to be optimal without further analysis. Further details regarding operations 610-660 are described above with reference to FIGS. 1A and 3-5.

Figure 7:
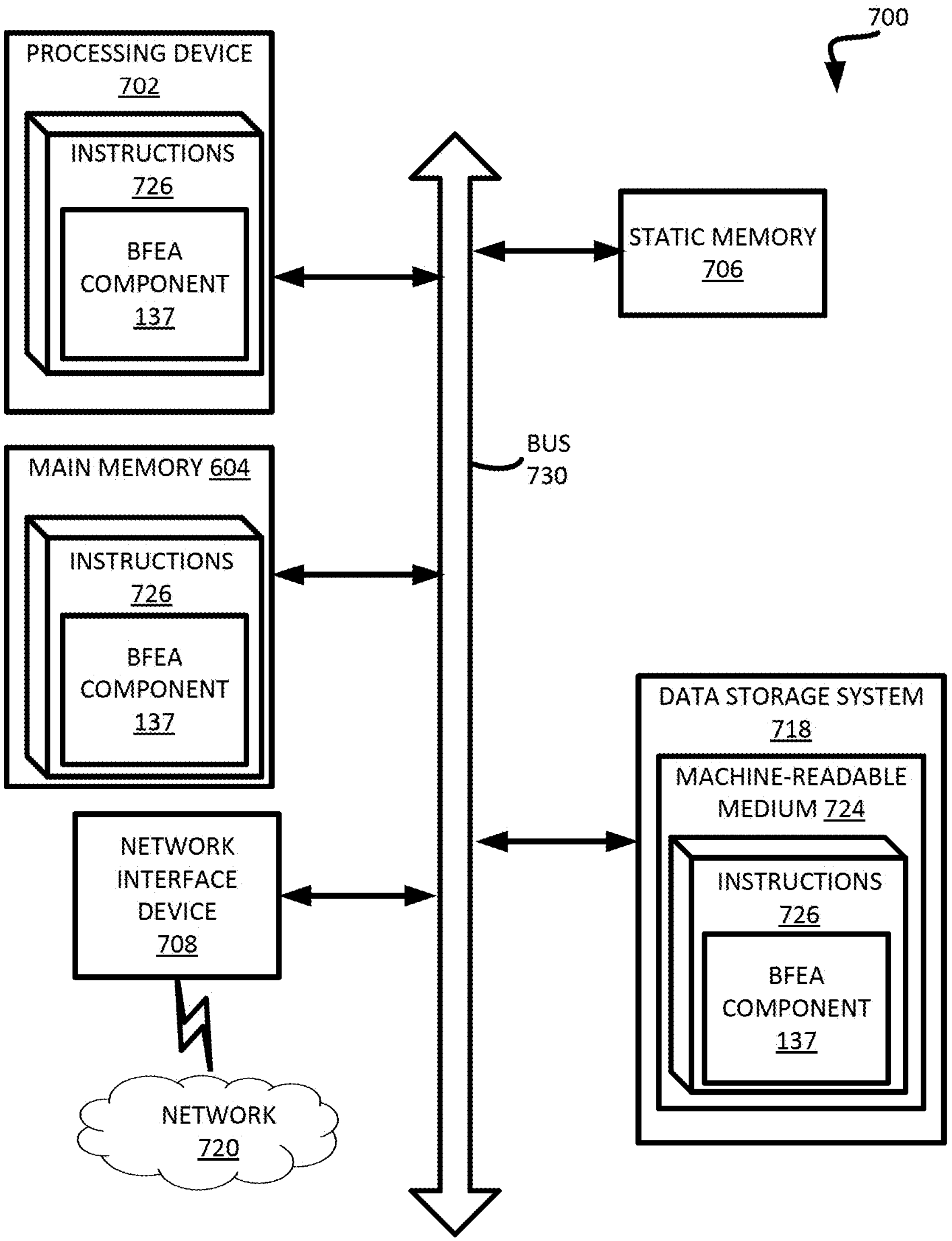
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the BFEA component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 602 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a BFEA component (e.g., the BFEA component 137 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
a controller, operatively coupled to the memory array, configured to:
identify a read level offset assigned to a final bin in a scan order defined for a set of bins, wherein each bin of the set of bins is associated with a respective block family comprising one or more blocks of memory cells that have been programmed within a certain time window;
identify a set of bit error metric values by performing, using the read level offset, a scan operation with respect to a block of memory cells of the memory array;
determine whether a final bit error metric value of the set of bit error metric values is greater than or equal to a threshold value;
in response to determining that the final bit error metric value is greater than or equal to the threshold value, identify a lowest bit error metric value of the set of bit error metric values; and
select, from the set of bins, a bin having an assigned read level offset corresponding to the lowest bit error metric value.

2. The memory device of claim 1, wherein the controller is further configured to:
detect a power on event; and
in response to detecting the power on event, select the block from a plurality of blocks of memory cells.

3. The memory device of claim 2, wherein the controller is further configured to:
in response to selecting the block, select, from the set of bins, a first bin assigned with a first read level offset resulting in a first bit error metric value.

4. The memory device of claim 3, wherein the controller is further configured to:
determine whether the first bin is an initial bin of the scan order; and
in response to determining that the first bin is not the initial bin of the scan order, obtain a second bit error metric value using a second read level offset assigned to a second bin of the set of bins, wherein the second bin immediately precedes the first bin in the scan order.

5. The memory device of claim 4, wherein the controller is further configured to:
determine whether the second bit error metric value is greater than the first bit error metric value;
in response to determining that the second bit error metric is greater than the first bit error metric, obtain a read delay measurement, wherein the read delay measurement is associated with an amount of time it takes for read data to be transferred from the block to a data register; and
identify a state of the block based on the read delay measurement.

6. The memory device of claim 5, wherein the state of the block is a transient state and the bin selected from the set of bins is the first bin.

7. The memory device of claim 5, wherein the state of block is a non-transient state and the bin selected from the set of bins is the second bin.

8. A method comprising:
identifying, by a processing device, a read level offset assigned to a final bin in a scan order defined for a set of bins, wherein each bin of the set of bins is associated with a respective block family comprising one or more blocks of memory cells that have been programmed within a certain time window;
identifying, by the processing device, a set of bit error metric values by performing, using the read level offset, a scan operation with respect to a block of memory cells of a memory array;
determining, by the processing device, whether a final bit error metric value of the set of bit error metric values is greater than or equal to a threshold value;
in response to determining that the final bit error metric value is greater than or equal to the threshold value, identifying, by the processing device, a lowest bit error metric value of the set of bit error metric values; and
selecting, by the processing device from the set of bins, a bin having an assigned read level offset corresponding to the lowest bit error metric value.

9. The method of claim 8, further comprising:
detecting, by the processing device, a power on event; and
in response to detecting the power on event, selecting, by the processing device, the block from a plurality of blocks of memory cells.

10. The method of claim 9, further comprising:
in response to selecting the block, selecting, by the processing device from the set of bins, a first bin assigned with a first read level offset resulting in a first bit error metric value.

11. The method of claim 10, further comprising:
determining, by the processing device, whether the first bin is an initial bin of the scan order; and
in response to determining that the first bin is not the initial bin of the scan order, obtaining, by the processing device, a second bit error metric value using a second read level offset assigned to a second bin of the set of bins, wherein the second bin immediately precedes the first bin in the scan order.

12. The method of claim 11, further comprising:
determining, by the processing device, whether the second bit error metric value is greater than the first bit error metric value;
in response to determining that the second bit error metric is greater than the first bit error metric, obtaining, by the processing device, a read delay measurement, wherein the read delay measurement is associated with an amount of time it takes for read data to be transferred from the block to a data register;
identifying, by the processing device, a state of the block based on the read delay measurement.

13. The method of claim 12, wherein the state of the block is a transient state and the bin selected from the set of bins is the first bin.

14. The method of claim 12, wherein the state of block is a non-transient state and the bin selected from the set of bins is the second bin.

15. A non-transitory computer-readable storage medium comprising instructions that, when executed by a processing device, cause the processing device to perform operations comprising:
identifying a read level offset assigned to a final bin in a scan order defined for a set of bins, wherein each bin of the set of bins is associated with a respective block family comprising one or more blocks of memory cells that have been programmed within a certain time window;

identifying a set of bit error metric values by performing, using the read level offset, a scan operation with respect to a block of memory cells of a memory array;

determining whether a final bit error metric value of the set of bit error metric values is greater than or equal to a threshold value;

in response to determining that the final bit error metric value is greater than or equal to the threshold value, identifying a lowest bit error metric value of the set of bit error metric values; and selecting, from the set of bins, a bin having an assigned read level offset corresponding to the lowest bit error metric value.

16. The non-transitory computer-readable storage medium of claim 15, wherein the operations further comprise:

detecting a power on event; and in response to detecting the power on event, selecting the block from a plurality of blocks of memory cells; and in response to selecting the block, selecting, from the set of bins, a first bin assigned with a first read level offset resulting in a first bit error metric value.

17. The non-transitory computer-readable storage medium of claim 16, wherein the operations further comprise:

determining whether the first bin is an initial bin of the scan order; and in response to determining that the first bin is not the initial bin of the scan order, obtaining a second bit error metric value using a second read level offset assigned to a second bin of the set of bins, wherein the second bin immediately precedes the first bin in the scan order.

18. The non-transitory computer-readable storage medium of claim 17, wherein the operations further comprise:

determining whether the second bit error metric value is greater than the first bit error metric value;

in response to determining that the second bit error metric is greater than the first bit error metric, obtaining a read delay measurement, wherein the read delay measurement is associated with an amount of time it takes for read data to be transferred from the block to a data register; identifying a state of the block based on the read delay measurement.

19. The non-transitory computer-readable storage medium of claim 18, wherein the state of the block is a transient state and the bin selected from the set of bins is the first bin.

20. The non-transitory computer-readable storage medium of claim 18, wherein the state of block is a non-transient state and the bin selected from the set of bins is the second bin.

* * * * *